(12) United States Patent
Cook

(10) Patent No.: US 7,088,377 B2
(45) Date of Patent: Aug. 8, 2006

(54) SYSTEM AND METHOD FOR DESIGNING, SYNTHESIZING AND ANALYZING COMPUTER GENERATED MECHANISMS

(76) Inventor: Jonathan B. Cook, 1750 Franklin St., Apartment #14, San Francisco, CA (US) 94109

( * ) Notice: Subject to any disclaimer, the term of this patent is extended or adjusted under 35 U.S.C. 154(b) by 504 days.

(21) Appl. No.: 09/882,551

(22) Filed: Jun. 15, 2001

(65) Prior Publication Data

US 2002/0019727 A1 Feb. 14, 2002

Related U.S. Application Data

(60) Provisional application No. 60/212,206, filed on Jun. 16, 2000.

(51) Int. Cl.
*G06T 17/00* (2006.01)

(52) U.S. Cl. .................. 345/649; 345/653; 345/672; 345/679

(58) Field of Classification Search ............ 345/419, 345/420, 649, 653, 672, 679, 473, 474, 475, 345/964
See application file for complete search history.

(56) References Cited

U.S. PATENT DOCUMENTS

| | | | | |
|---|---|---|---|---|
| 5,043,929 A | | 8/1991 | Kramer et al. ............. | 364/578 |
| 5,165,015 A | * | 11/1992 | Coggins ................... | 395/155 |
| 5,179,525 A | | 1/1993 | Griffis et al. ............. | 364/512 |
| 5,253,189 A | | 10/1993 | Kramer .................... | 364/578 |
| 5,297,057 A | | 3/1994 | Kramer et al. ............. | 364/512 |
| 5,396,160 A | | 3/1995 | Chen ....................... | 318/573 |
| 5,548,706 A | | 8/1996 | Koizumi et al. .......... | 395/161 |
| 5,604,848 A | | 2/1997 | Harada et al. ............. | 395/119 |
| 5,760,906 A | | 6/1998 | Sato ........................ | 356/376 |
| 5,835,693 A | | 11/1998 | Lynch et al. .............. | 395/173 |
| 5,914,553 A | | 6/1999 | Adams et al. ............. | 310/309 |
| 5,945,994 A | | 8/1999 | Shimizu et al. ........... | 345/418 |

FOREIGN PATENT DOCUMENTS

JP    09-247625    10/1997

OTHER PUBLICATIONS

Chedmail, P. et al., "Robot Mechanism Synthesis and Genetic Algorithms", *Proceedings of the 1996 IEEE International Conference on Robotics and Automation*, Apr. 4, 1996, 4, 3466–3471.

Erdman, A.G. et al., "New Software Synthesizes Complex Mechanisms", *Machine Design*, Aug. 22, 1985, 107–113, XP–000601787.

(Continued)

*Primary Examiner*—Almis R. Jankus
(74) *Attorney, Agent, or Firm*—Woodcock Washburn LLP

(57) ABSTRACT

A computer graphics and analysis application improvement providing calculation, regeneration, and display of mechanism solutions based on inputted desired functions such as part positions by extracting functional requirements data from such inputted data so that the designer or engineer can view the mechanism solutions in space and thereby design the desired mechanism or mechanisms. The computing application extracts the functional requirements data (such as point and angular references) from the inputted function data, such as part positions. Using the inputted data, the computing application calculates, generates, and displays mechanism solutions based on the function or functions and provides the engineer or designer with meaningful visualization of how the mechanism would work, for example by showing how the part would move through desired positions in space, in addition to including the mechanism's or mechanisms' motion path, coupler curve, and other visual data helpful to the engineer in the design of the mechanism.

26 Claims, 16 Drawing Sheets

OTHER PUBLICATIONS

Hoskins, J.C. et al., "Synthesis of Mechanical Linkages using Artifical Neural Networks and Optimization", *Proceedings of the International Conference on Neural Networks,* 822J–822N, XP–010111695.

McCarthy, J.M., "Mechanism Synthesis and Theory and the Design of Robots", *Proceedings of the 2000 IEEE International Conference on Robotics & Automation,* 2000, 1, 55–60, XP010500199.

Thoreson, J. et al., "Designing Mechanisms for Production Equipment", *Machine Design,* 1988, 113–117, XP 000112779.

* cited by examiner

US 7,088,377 B2

SYSTEM AND METHOD FOR DESIGNING, SYNTHESIZING AND ANALYZING COMPUTER GENERATED MECHANISMS

PRIORITY

This application is related to and claims priority under 35 U.S.C. § 119(e) to U.S. Provisional Patent Application Ser. No. 60/212,206, filed Jun. 16, 2000, entitled "SYSTEM AND METHOD FOR SYNTHESIZING AND ANALYZING COMPUTER GENERATED MECHANISMS", the contents of which are hereby incorporated by reference in their entirety.

FIELD OF THE INVENTION

The present invention relates generally to design, synthesis and modeling of mechanisms, and more specifically to computerized mechanism synthesis and analysis on computer applications such as Computer Aided Design (CAD).

BACKGROUND OF THE INVENTION

Designers and engineers alike are constantly challenged to design, build, and implement new and varied constructs to satisfy market demands. Interestingly, there lies a commonality of basic design components and engineering fundamentals among all constructs. Using these concepts, designers and engineers are capable of creating a variety of mechanisms (e.g. from a simple toy to complex robotic systems). A mechanism is generally a combination of geometric bodies that constitute a machine or part of a machine or device with moving part(s) that move in order to perform a function. Also, they may contain rigid or resistant bodies formed and connected so that they move with definite relative motions with respect to one another. However, mechanism design requires a number of complex calculations to ensure that the designed mechanism is capable of performing intended functions. These calculations can completely engross the most proficient designer and/or engineer and, if left to manual acumen is an extremely daunting task.

With the proliferation of computing technologies, computing applications have been and are being developed to assist designers and engineers to perform calculations required for the design and analysis of mechanisms. The most commonly used computing application for design is a Computer Aided Design (CAD) computing application. Generally, CAD is considered the modeling of physical systems on computers, allowing both interactive and automatic analysis of design variants, and the expression of designs in a form suitable for manufacturing. A designer or engineer using CAD is afforded the ability to create, model, and analyze desired physical systems in a computerized realm. However, the functionality offered typical CAD applications is generally directed towards the creation and manipulation of graphic representations of a desired construct and not the design of mechanisms.

A common characteristic of graphics and analysis applications is how parts, whether mechanical, electronic or of whatever kind are designed. They are typically designed in an interactive mode. That is, the part, as far as already designed, is displayed on a display device (e.g. as two-dimensional, or as perspective view) such as a CRT (cathode ray tube) or an LCD (liquid crystal display). The user enters commands via appropriate input means, preferably a computer mouse, a graphics tablet or a light pen in order to complement or modify the existing structure. When the editing process is finished, i.e., the part is defined, it may be plotted or otherwise be reproduced. Further, it is also possible to generate and communicate CAD information to an interface that can directly control a numerically controlled machine tool, in order to manufacture a physical representation of the object (e.g. a Computer Assisted Manufacturing (CAM) interface).

Typically, CAD provides a designer with tools to facilitate the drawing, rotating, scaling, or moving of a desired construct. These functions are accomplished by selecting the items to be manipulated and then entering a suitable command through a user interface such as a keyboard or mouse to apply the sought after function. In addition, some CAD applications may provide additional functionality in the form of analysis tools to assist a designer in modeling the behavior of a desired construct.

Similar to CAD, development has been made in the computing industry to provide computing applications that have the ability to perform complex modeling and analysis of created constructs (e.g. the modeling and analysis of mechanisms). These computing applications allow engineers to model mechanisms and their corresponding linkages by specifying linkage lengths and the joints between links. Once the links and joints are defined, specialized inputs are added to the model to define the input motion of the mechanism. This process has significantly reduced the time to analyze mechanisms as compared to traditional ruler and compass calculation methods.

In design, defining a mechanism's function is a crucial component of design. For example, a designer contemplating the design of a mechanism for a car trunk hood may be required to determine if the car trunk hood will behave in harmony with the rest of the car. In other words, the function of the trunk may be specified to work properly with the car. The proper function of the mechanism that opens the trunk could be defined such that the trunk hood be able to reach three positions; a closed position, an open position, and a semi open position where the trunk hood does not interfere with the body of the car. Conventionally, the designer or engineer is left with the very difficult task of figuring out how to design a trunk mechanism that will achieve the desired function of having the parts (in this case, the hood) be in the desired positions. Once the designer or engineer calculates what he or she believes may be a solution for the mechanism, he or she inputs the data into an analysis computer aided design program to test whether it will work. The general method for representing the trunk hood is to use a point in space and an angular reference to represent the angle of the trunk hood. For example the trunk hood could initially be located in 3D (X,Y,Z) space at a 0,0,0 position and be horizontal with an angle of 0 degrees. The final position could have the trunk hood a 10,10,0 position in a vertical position with an angle of 90 degrees. The solution set to this problem is infinite, but the designer or engineer is limited by his own assumptions and/or his skill, experience, time and cost to design, build, test, and then iterate until he or she finds a satisfactory solution. If additional requirements are given, such as the links of the mechanism must fit into the car body, then many of the solutions will not meet the mechanism requirements, and the designer or engineer will have a more difficult time finding solutions or may have to limit the requirements and/or modifications he or she desires to make to the mechanism. Often the designer or engineer is forced to perform an iteration process involving several design and redesign attempts to achieve a mechanism that behaves within the set of predefined parameters. Such practice demands significant time and energy from designers and/or engineers. Additionally, the engineer or designer generally has great difficulty visualizing how the trunk hood will move in 3D space between the initial, intermediate and final positions when functional requirements are defined solely by three points and angular references at those points.

Synthesis, on the other hand, is a method of designing mechanisms starting with a desired function. Therefore, solutions are found much more quickly, without such an extensive iteration process. Furthermore, by being enabled to first select desired part positions (i.e., the desired function of the mechanism) and having functional mechanism requirements data be extracted from such positions and put into the solver, the designer or engineer could actually visualize the mechanism solutions and parts in space and significantly reduce the time, cost, and other limitations involved and achieve infinite solutions for the desired mechanism.

From the foregoing it is appreciated that there exists a need for mechanism synthesis and analysis systems and methods that overcome existing practices of the prior art. It would thus be advantageous to provide systems and methods that better help define the function of the desired mechanism. Therefore, a system that could extract the functional mechanism requirements (the points in space and the angular references) from CAD data is highly desirable. By doing so, the present invention is left to extract the functional mechanism requirements directly from CAD data to achieve and display meaningfully viewable mechanism solutions based on the engineer or designer's desired function for the mechanism.

SUMMARY OF THE INVENTION

The present invention provides an apparatus and methods for the computerized graphic synthesis and analysis of mechanisms allowing for extraction of functional requirements directly from CAD data.

In a computing system capable of running a computer graphics and synthesis application such as computer aided design (CAD), the computing system having at least one user interface and a display device, a mechanism or mechanism elements may be created or retrieved on a computer graphics synthesis and analysis application through operator input. The present invention extracts functional information from the CAD data and uses the inputted data to calculate a solution or solutions. The invention displays the input and processed parameters as graphic representations in accordance with the computer graphics synthesis and analysis application.

BRIEF DESCRIPTION OF THE DRAWINGS

The mechanism synthesis and analysis apparatus and methods of the present invention will become more apparent and more readily appreciated from the following detailed description of illustrative implementations of the invention taken in conjunction with the accompanying drawings of which.

DETAILED DESCRIPTION OF ILLUSTRATIVE IMPLEMENTATION

Figure 1:
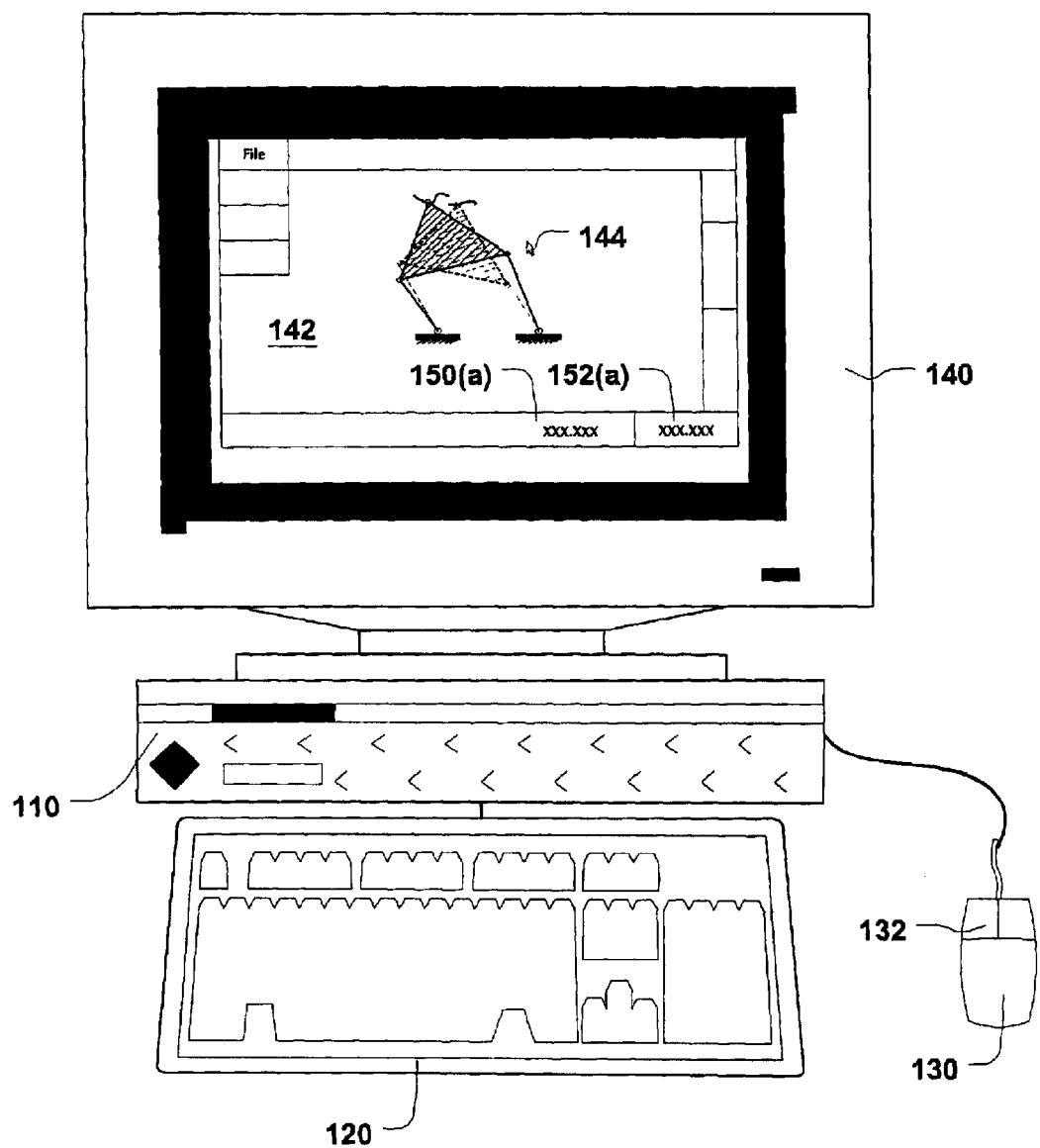
FIG. 1 shows a computer system running in accordance with the present invention.

Overview:

Computer graphics are used today in many different areas of industry, business, government, education, entertainment, and in the home. In computer-aided design (CAD), interactive graphics are used to design components and systems of mechanical, electrical, electromechanical and electronic devices. To name a few, these systems include structures (such as buildings, chemical and power plants, automobile bodies, airplane and ship hulls and their contents), machines of varying complexity, optical systems and computer networks. The emphasis is sometimes only on producing precise drawings of components and (sub)assemblies, as in online drafting and architectural rendering. More frequently, however, the emphasis is on interacting with a computer-based model of the component or system being designed in order to test, for example, its mechanical, electrical or thermal properties. Often the model is interpreted by a simulator (an additional computing application interacting with the CAD application) which feeds back the behavior of the system to the display console operator for further interactive design and test cycles.

In general, computer graphics systems comprise an input unit (e.g. keyboard, mouse, graphics tablet, or stylus pen), a processing unit (CPU), a display device (e.g. CRT or LCD), and an output unit (e.g. plotter and printer). In use, the designer enters specific instructions into the processing unit through the input unit to prepare an intended design item (drawing). During the design process or upon completion thereof, the processing unit causes the display unit to display a design image, or causes the output unit to make a printout.

A design item may be assembled from line segments, circles and arcs for example. Each of the line segments can be defined by the coordinates, in an XYZ-coordinate system, of the respective ends of the line segment. Each of the circles can be defined by the XYZ-coordinates of the circle center point as well as the radius of the circle. Each of the arcs can be defined by the XYZ-coordinates of the respective ends of the arc as well as the radius of the arc. Further, either of the above-described design elements can also be defined by polar coordinates combined with radius values (where applicable). However, XYZ-coordinates and polar coordinates are mutually convertible, so that the difference between the two methods of performing element definition is insignificant. It should be appreciated that the element definition data may additionally include pieces of information relating the kinds of lines (e.g. thick lines, thin lines, broken lines, chain lines, and so forth) and/or the colors of lines. Moreover, sophisticated applications may contain rendering functionality which applies textured surfaces to created structures indicating shadows and light reflections.

Further, a design item is formed by entering definition data for various design elements through the keyboard or by plotting the end points for a line segment on the display device. The designed image is stored in the memory not as image data but as a combination of the definition data for the various elements. Thus, the element definition data stored in the memory can be conveniently used for analyzing the formed design item.

In the context of designing mechanisms, current CAD applications generally provide modeling and analysis functions, offering limited functionality as to the design of mechanisms based on desired function(s). Those CAD applications that do provide mechanism design and analysis functions, however, even to the extent that they allow for synthesis of mechanisms, do not assist participating designers and/or engineers by extracting CAD data to specify functional mechanism requirements. Rather, the arduous and often time-consuming and mind-numbing task of mechanism synthesis and analysis is left to the participating designer and/or engineer without the ability to visualize solutions based on CAD data in a meaningful way.

For example, a designer and/or engineer may be charged with the task of designing a trunk hood for a car. The trunk hood is to have specific dimensions so that it can cooperate with the rest of the designed car frame. In addition, the trunk hood is to have a specific degree of motion such that it can open and close through a pre-determined arc. Using current practices, the designer and/or engineer is left to first model the trunk hood in a modeling environment (e.g. CAD design environment) to ensure that it meets required dimensional specifications. From there, the designer and/or engineer would engage in an iterative process of designing possible mechanism solutions (possibly by using the analysis functionality offered by the CAD computing application to test it after it is already designed and built) to operate on the designed trunk hood in an effort to meet positional specifications for the trunk hood. This process can be extremely time consuming and frustrating resulting in endless hours of wasted time, time that may be better spent in other design efforts. Even in the event the designer or engineer is able to use synthesis techniques to design the mechanism, he or she is unable to visualize the working mechanisms' parts in space to actually understand the mechanism solutions sufficiently.

The present invention ameliorates the shortcomings of the prior art by providing mechanism synthesis and analysis systems and methods that allow designers and/or engineers to synthesize mechanisms to operate desired constructs by processing inputs (e.g. parameters) representing desired mechanical constructs. The construct could then be modeled in three-dimensional space having a beginning, end and/or other positions. The computing application would then extract point and angular data from the 3 dimensional input positions. These systems and methods may generate, display, and animate a mechanism having these calculated mechanism characteristics in accordance with the user inputs. By doing so, drastic inefficiencies are reduced and designers, and engineers alike, are afforded the ability to model their mechanical constructs to see if they would be a feasible part of their intended overall design. In the example of the trunk hood, the engineer may envision a first design for a trunk hood based on dimensional specifications and function. Using the present invention, the designer and/or engineer inputs dimensional and functional design parameters (e.g. size and shape of trunk hood and starting position and end position) for the envisioned trunk hood. The present invention processes these parameters (e.g. using position data of the inputted construct and extracting point and angular references) and synthesizes mechanisms that operate on the inputted construct to perform the desired functions. In this case, mechanisms would be synthesized to allow the trunk hood to move from an open to a closed position in accordance with required functional specifications.

As will be described below with respect to FIGS. 1–5, the present invention is directed to a system and methods that enable the calculation and synthesis of mechanisms to generate mechanism solutions based on inputted desired functions such as part positions by extracting functional requirements data from such inputted data so that the designer or engineer can view the mechanism solutions in space and thereby design the desired mechanism or mechanisms. In accordance with an illustrative implementation thereof, the present invention comprises a system and method that couples an operator with the graphic representation of a desired function, allowing calculation and synthesis of mechanisms to generate mechanism solutions based on inputted desired functions such as part positions by extracting functional requirements data from such inputted data so that the designer or engineer can view the mechanism solutions in space and thereby design the desired mechanism or mechanisms.

In an illustrative implementation, described more fully hereinafter, the methods and apparatus of the present invention may be implemented as part of a desktop computer system having a graphic synthesis and analysis computing application, such as computer aided design (CAD), employing at least one input interface device, a microprocessor, memory, and a display device. Although the depicted embodiment provides a CAD computer synthesis and analysis computing application running on a desktop computer system having one computer processing unit, a mouse, a keyboard, and a cathode ray tube (CRT) display device, those skilled in the art will appreciate that the inventive concepts described herein extend to various types computer graphics design, synthesis and/or analysis computing applications running on various types of computer systems having different computing interfaces running different computing operating systems and having varying hardware configurations.

System Description and Processing:

FIG. 1 shows computer system 100 having a processing unit 110, an operator input interface keyboard device 120, an operator input interface pointer device 130, and display device 140. Computer processing unit 110 contains a microprocessor or another central processing unit (CPU), memories, and all associated electronics to run various computing applications. The computing system 100 runs a computer graphics synthesis and analysis application 142 (e.g. such as CAD) on computer processing unit 110. In an effort to synthesize a mechanism, an operator (not shown) inputs instructions to computer graphics synthesis and analysis application 142 through operator input interface keyboard device 120 or operator input interface pointer device 130. Operator inputs are processed by computer graphics synthesis and analysis application 142 on computer processing unit 110 to create data sets. Additionally, the operator inputs are used by computer graphics synthesis and analysis application to calculate parameter specific to operator inputs. The data sets and parameters correlate to graphic representations within computer graphics synthesis and analysis application 142 that can be displayed to an operator on display 140 in parameter display areas 150(a) and 152(a).

Furthermore, in an illustrative implementation computer graphics and synthesis application 142 provides the operator the ability to input data relevant to a desired construct (e.g. car door, a crane arm, a drawbridge, etc.) or construct part such that the computing application may calculate and synthesize mechanisms based on inputted desired functions such as part positions by extracting functional requirements data from such inputted data so that the designer or engineer can view the mechanism solutions in space and thereby design the desired mechanism or mechanisms. This operation is achieved by first providing a desired construct in a first desired position and a second desired position, for example. The input process is achieved through the use of operator input interface keyboard device 120 or operator input interface pointer device 130. When communicating with computer graphics and synthesis application 142, a participating user inputs instructions to computer graphics synthesis and analysis application 142 through operator input interface devices 120 and 130. Operator interfaces 120 and 130 act to control graphic pointer 144 of computer graphic synthesis and analysis application 142. Pointer 144 has freedom of movement within computer graphic synthesis and analysis application 142. Computer graphics and synthesis application may process the inputs received from a participating user to calculate and synthesize a mechanism capable of traveling in through the first and second inputted construct positions.

Figure 2:
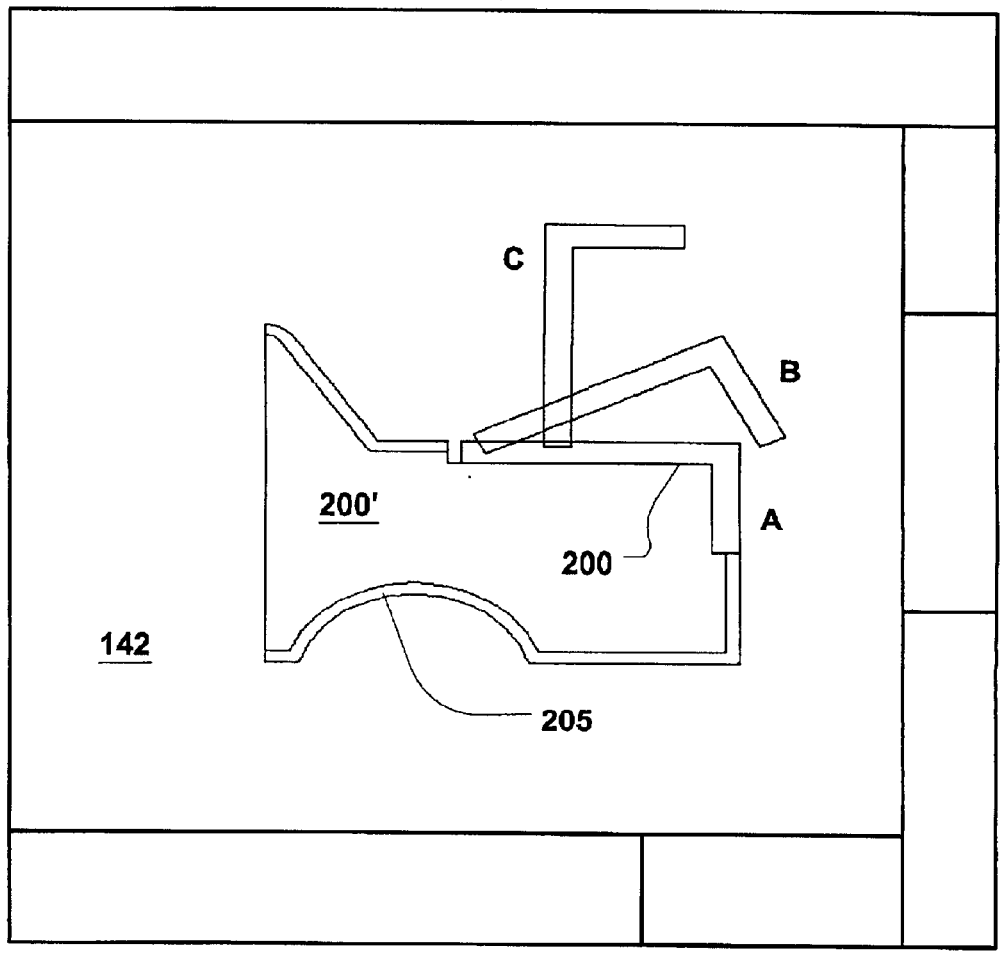
FIG. 2 is a representation of a display screen of an exemplary computer graphics and synthesis application showing an inputted construct in various desired positions for processing by the present invention.

FIG. 2 shows computer graphics and synthesis application 142 displaying an exemplary inputted construct 200'. Exemplary inputted construct 200' may be communicated by participating users (not shown) to computer graphics and synthesis application via operator interfaces (not shown) controlling graphic pointer 144. As shown, exemplary inputted construct 200' comprises car body 205 and trunk hood 200. Trunk hood 200 is inputted in three positions, a start position A, a mid (semi-closed) position B, and a final position C. The three positions inputted may represent trunk hood 200 in the closed, semi-open, and open positions. Computer graphics and synthesis application 142 receives these graphical parameter inputs and calculates and synthesizes a mechanism that may travel in accordance with the desired function of construct 200, that is the movement of trunk hood through positions A, B, and C respectively. Without this improvement, an engineer or designer may be relegated to first design and build a construct and hope that the construct contemplated behaves in an appropriate manner to make the construct feasible in an overall design.

Figure 2A:
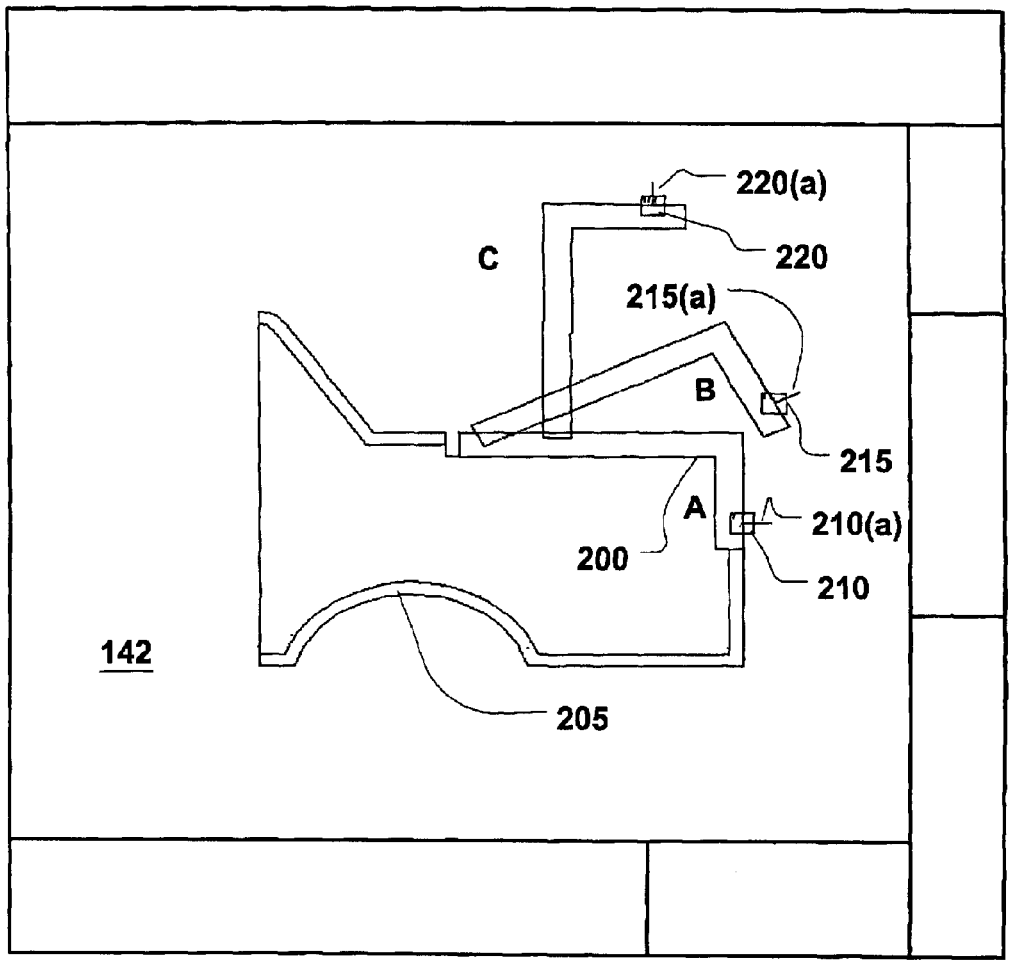
FIGS. 2A–2C are screen shots showing a vector representation of the inputted construct moving through a desired motion path in accordance with the present invention.
Figure 2B:
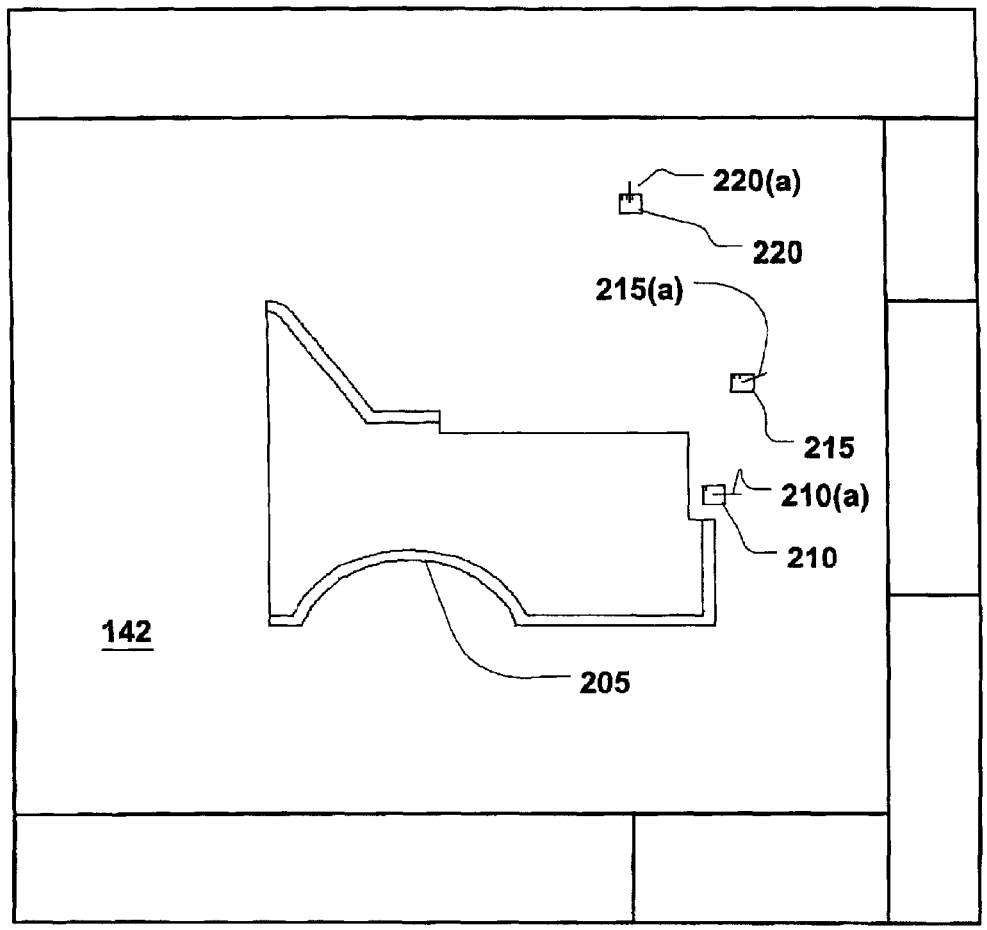
Figure 2C:
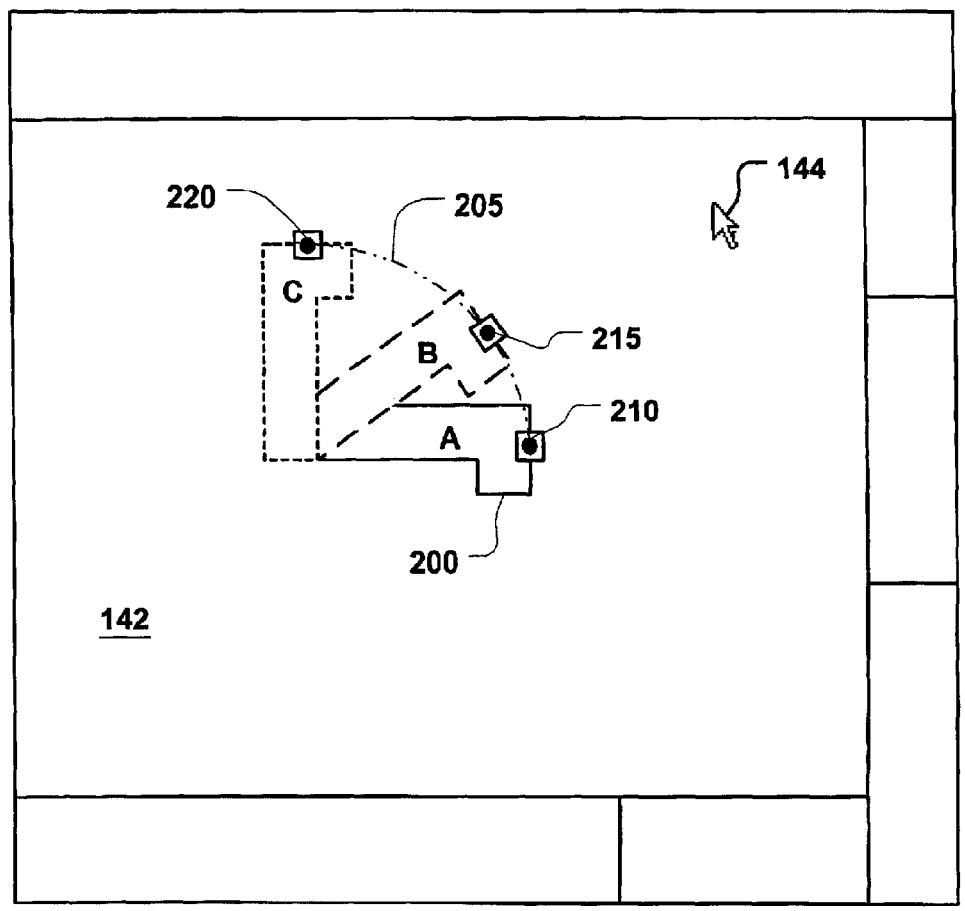

FIGS. 2A and 2B shows the relevant data that is extracted from inputted construct 200' in its various positions that may be used to synthesize mechanism solutions that will allow the construct to move through the inputted positions. As shown construct 200' comprises car body 205 and trunk hood 200 in three positions A, B, and C, respectively. The trunk hood 200 may be represented by vectors 210, 215, and 220 such that vector 210 provides a position value 200 and an angle value 210(a) representative of trunk hood 200 being in position A. Similarly, vector 215 provides a position 215 and an angle value 215(a) that is representative of trunk hood 200 having position B. Lastly, vector 220 provides a position value 220 and an angle value 220(a) representative of trunk hood 200 being placed in position C. The present invention extracts vectors 210, 215, and 220 from information inputted to generate trunk hood 200 in positions A, B, and C in the modeling space of exemplary computing application 142. FIG. 2C shows trunk hood 200 traveling through positions A, B, and C as represented by vectors 210, 215, and 220.

Figure 3:
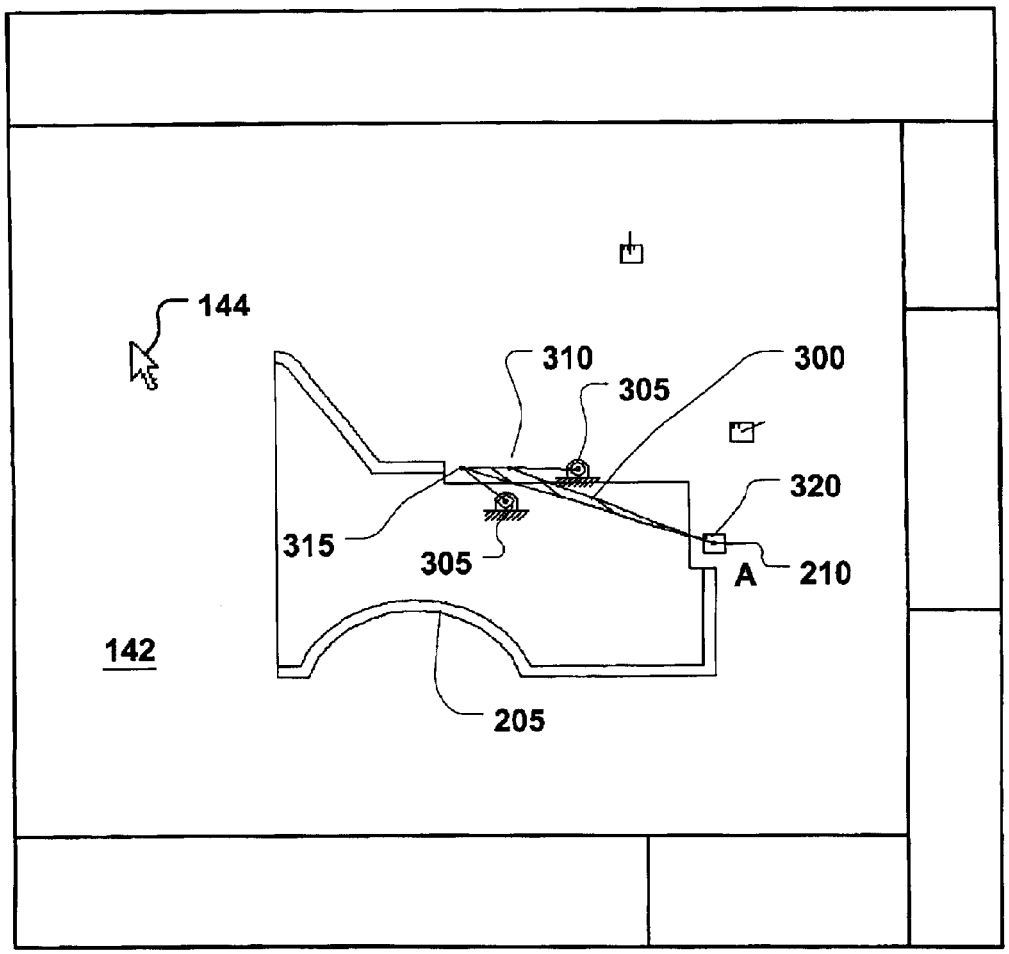
FIGS. 3, 3A and 3B are screen shots of the mechanism solution generated to accommodate the desired positions inputted for the inputted construct in accordance with the present invention.
Figure 3A:
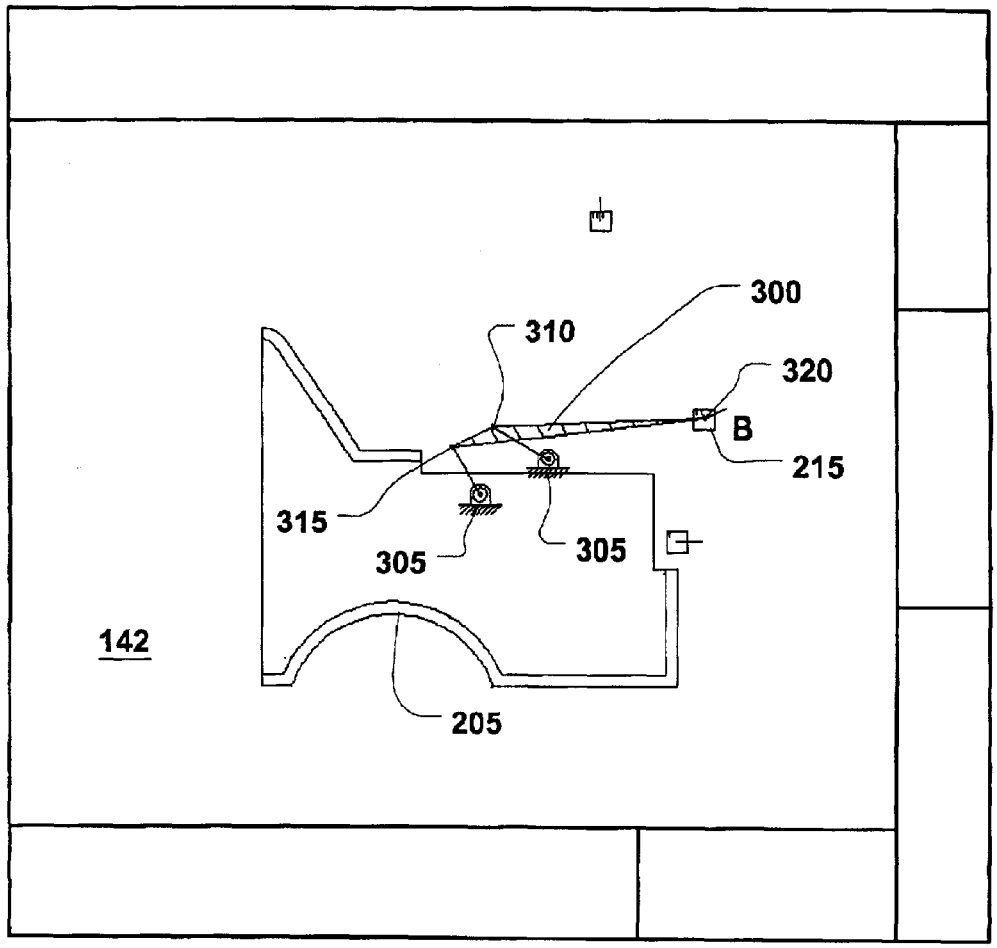
Figure 3B:
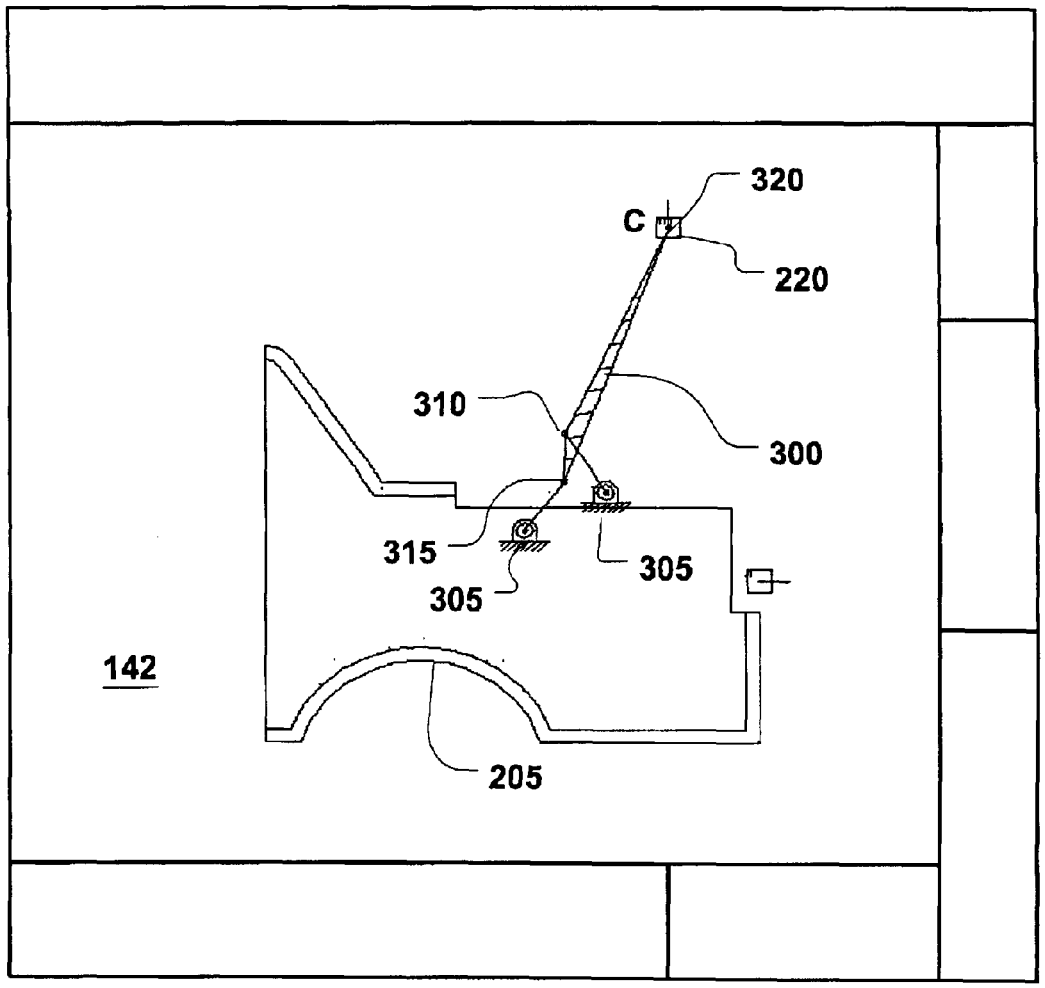
Figure 3C:
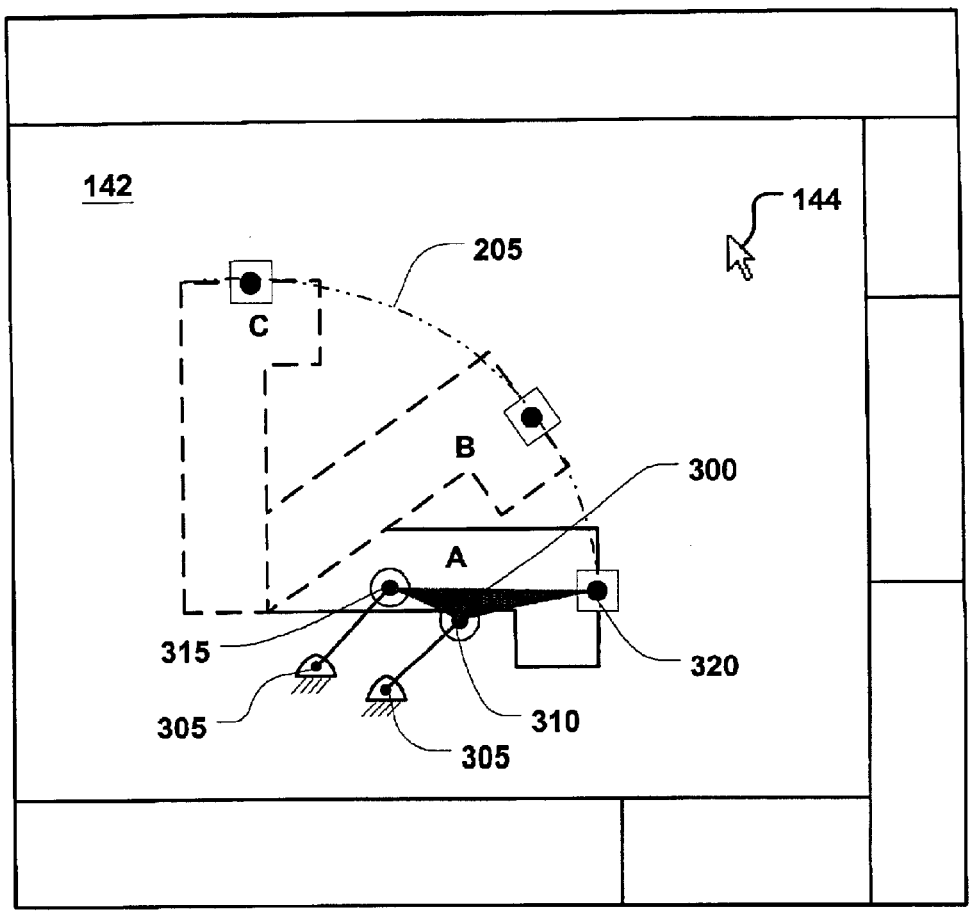
FIG. 3C is a screen shot showing the operation of the mechanism solution on the inputted construct in accordance with the present invention.

Using the extracted vector information, the present invention is capable of synthesizing mechanism solutions (e.g. one or more mechanisms and mechanism components) that would allow trunk hood 200 of inputted construct 200' to move along a motion path represented by positions A, B, and C. FIGS. 3–3C show an exemplary mechanism solution for the presented construct problem (i.e. the synthesis of a mechanism that operates on trunk hood 200 such that trunk hood is allowed to move through positions A, B, and C.) Specifically, FIG. 3 shows an exemplary mechanism solution for trunk hood 200 (not shown) so that trunk hood 200 (not shown) is in position A and as represented by vector 210. As shown, exemplary mechanism solution comprises ground linkage points 305 that are coupled to car body 200. Further, ground linkage points 200 are coupled to trunk hood 200 (not shown) at link points 310, 315, and 320. Link points 310, 315, and 320 come together to form link arm 300. FIGS. 3A and 3B show exemplary mechanism solution for trunk hood 200 so that trunk hood 200 (not shown) can be in positions B and C, respectively, and that are represented by vectors 215 and 200, respectively. In operation, exemplary mechanism solution allows trunk hood 200 (not shown) to move through positions A, B, and C.

FIG. 3C shows computer graphics and synthesis application displaying a calculated and generated mechanism 300 that provides motion path 205 of FIG. 2 and accommodates the inputted construct 200 of FIG. 2. Unlike, conventional synthesis systems and methods, the present invention allows participating users the ability to observe how the synthesized mechanism operates on the inputted construct. Stated differently, the present invention extracts data from the inputted construct (e.g. through position data of the construct inputted having various desired positions) to synthesize mechanisms that may be superimposed on the inputted construct such that the construct and mechanism can be observed in conjunction. Furthermore, the present invention contemplates the animation of the inputted construct (in two or three dimensions) to observe the operation of the mechanism and/or the construct in real time. FIG. 3C shows this feature of the present invention as the synthesized mechanism 300 is displayed to be operable on inputted construct (e.g. trunk hood 200). In an illustrative implementation, the present invention may animate trunk hood 200 for display such that trunk hood 200 moves through positions A, B, and C. When animating trunk hood 200, synthesized mechanism solution 300 can also be animated (depending on user preference) for display to show how the mechanism operates on the inputted construct. In the example provided, to show how mechanism solution 300 operates on trunk hood 200 to move trunk hood 200 through positions A, B, and C as shown in FIGS. 3–3B.

Figure 4:
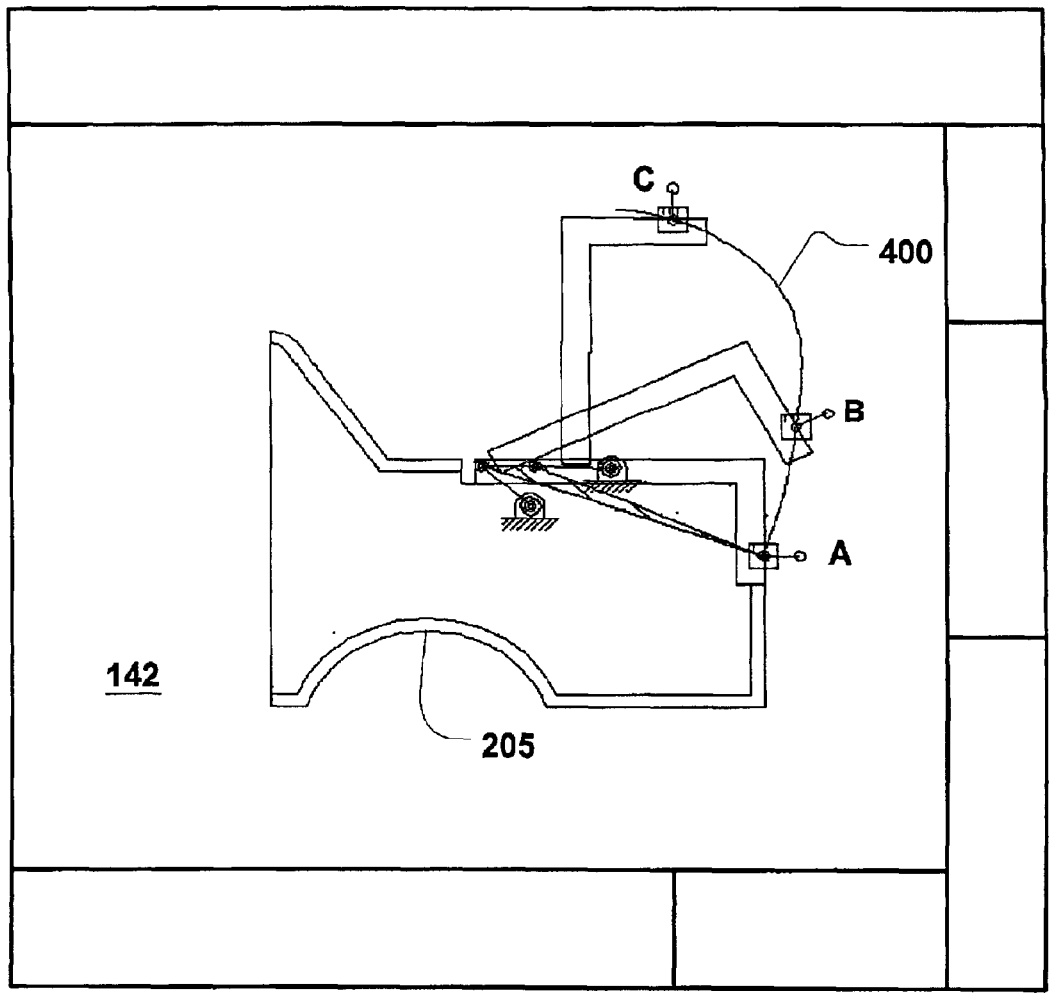
FIGS. 4–4B are screen shots showing analysis features for the mechanism solution in accordance with the present invention.
Figure 4A:
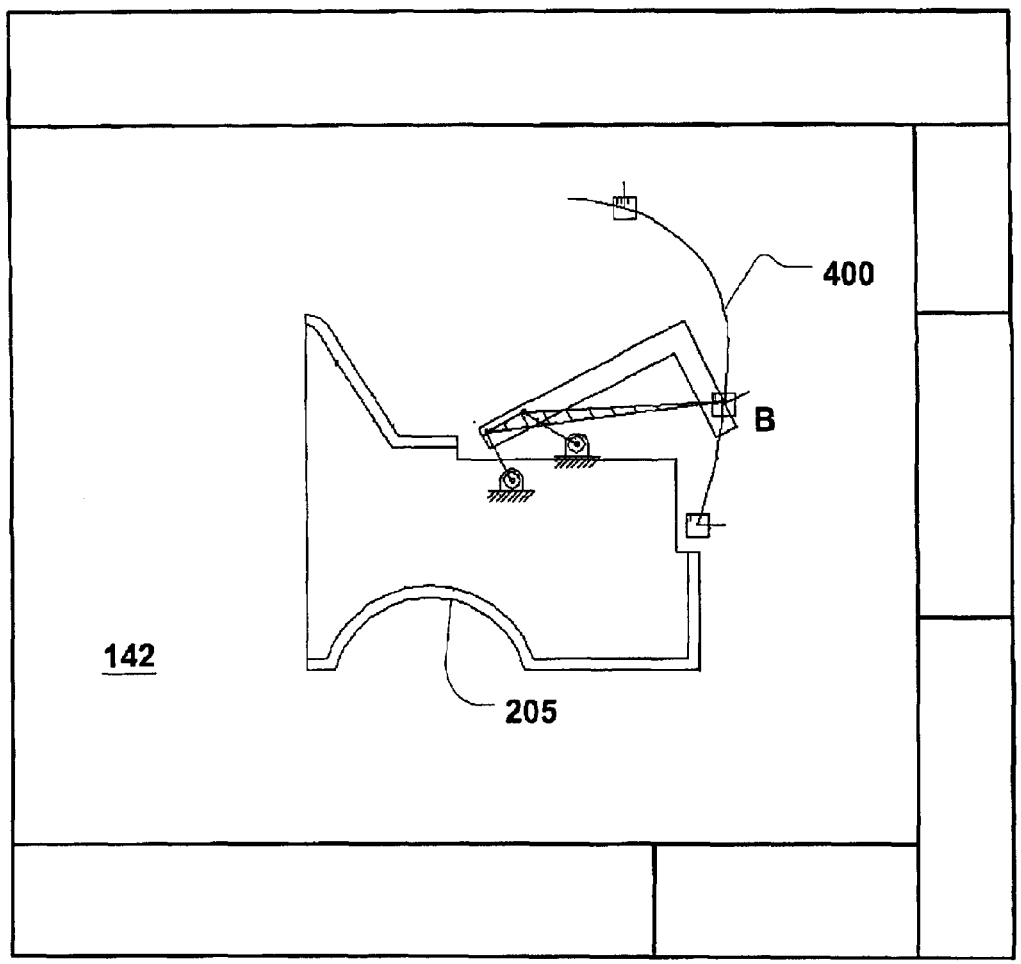
Figure 4B:
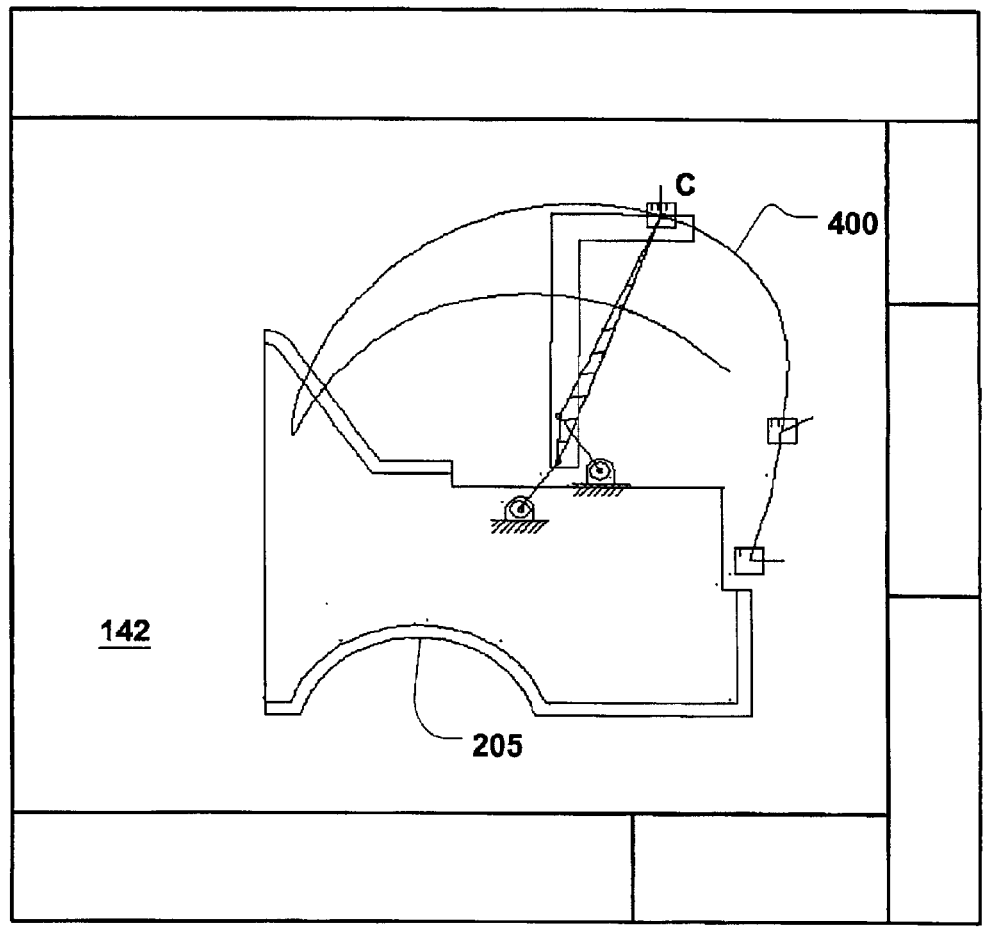

In line with the described feature, the present invention is also capable of performing analysis on the synthesized mechanisms to provide participating users relevant information about the synthesized mechanisms, such as vector information, mechanisms' coupler curves, and mechanism values. FIGS. 4–4B illustrate this feature of the present invention. As shown in FIGS. 4–4B, the coupler curve 400 for exemplary mechanism 300 is calculated and displayed as mechanism solution 300 moves trunk hood 200 through positions A, B, and C, respectively. As seen, coupler curve 400 changes as the mechanism moves through these various positions. With this feature, participating users are empowered with a effective tool that allows not only observation of synthesized mechanism operation but also of mechanism parameters.

Figure 5:
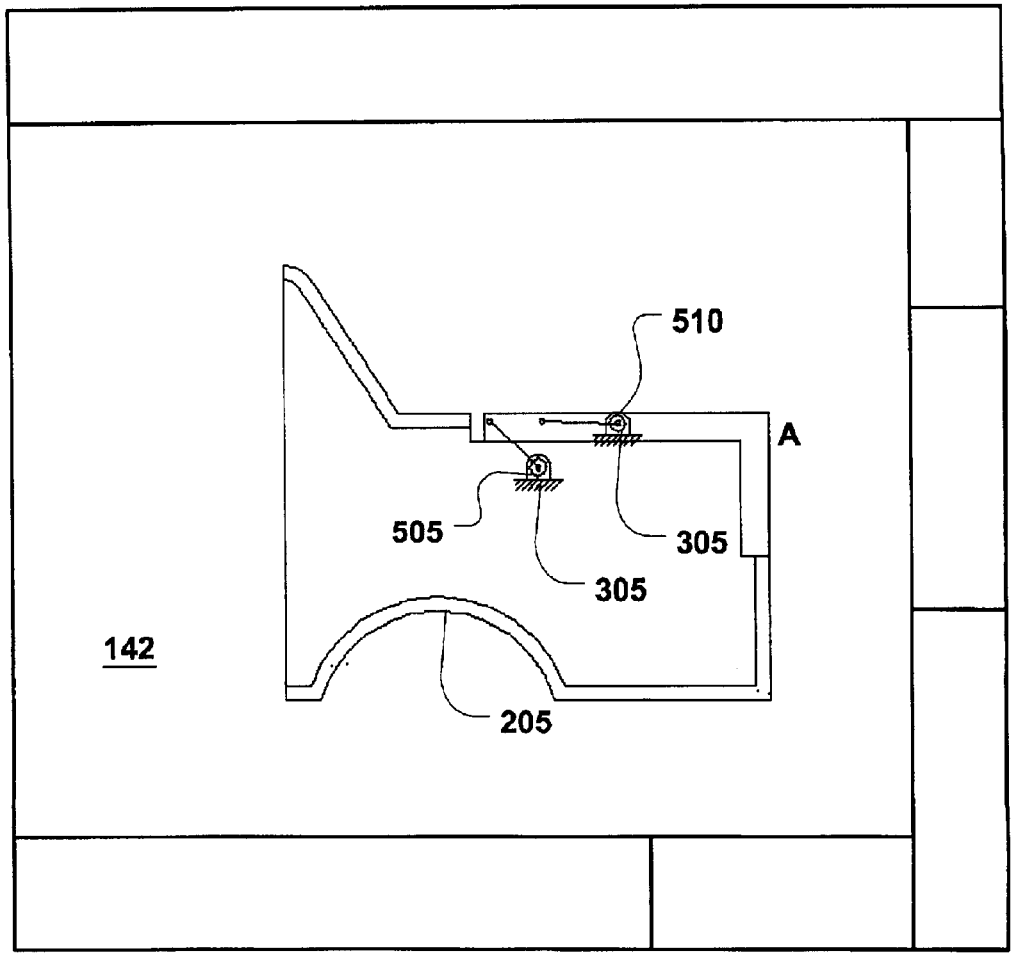
FIGS. 5–5B are screen shots showing an alternative implementation of a mechanism solution provided for the inputted construct in accordance with the present invention.
Figure 5A:
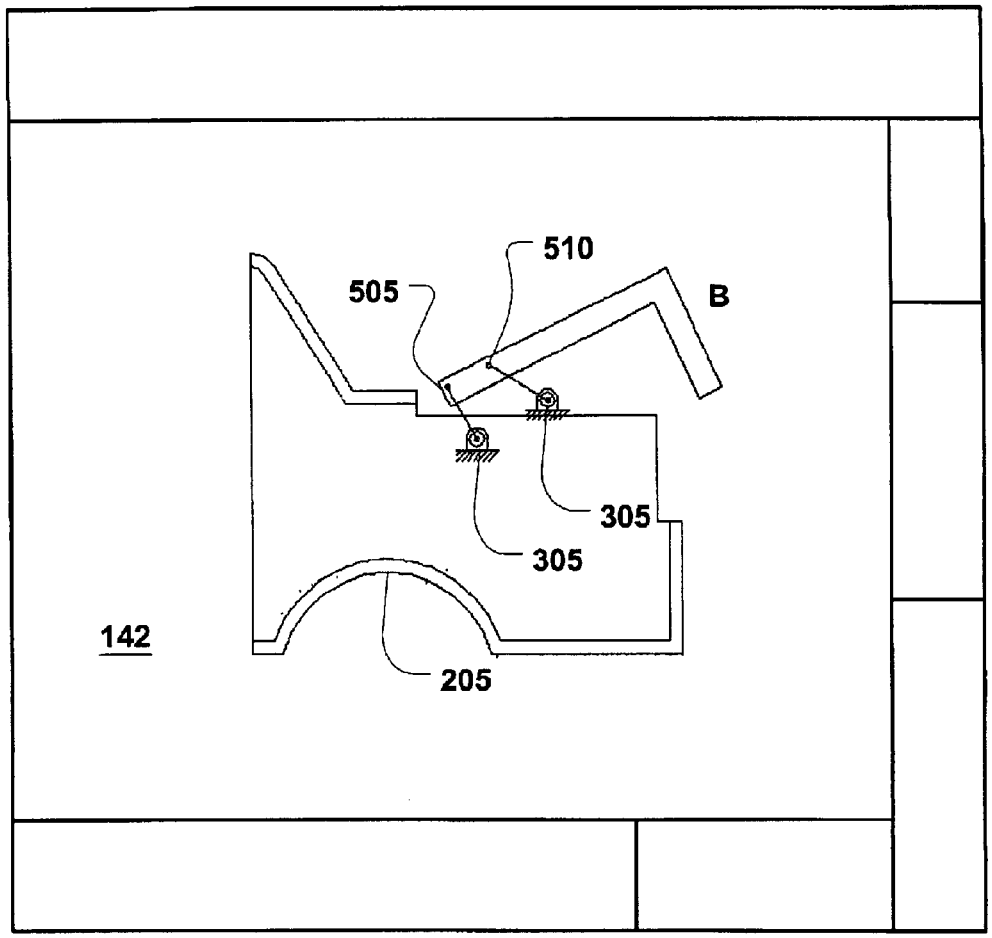
Figure 5B:
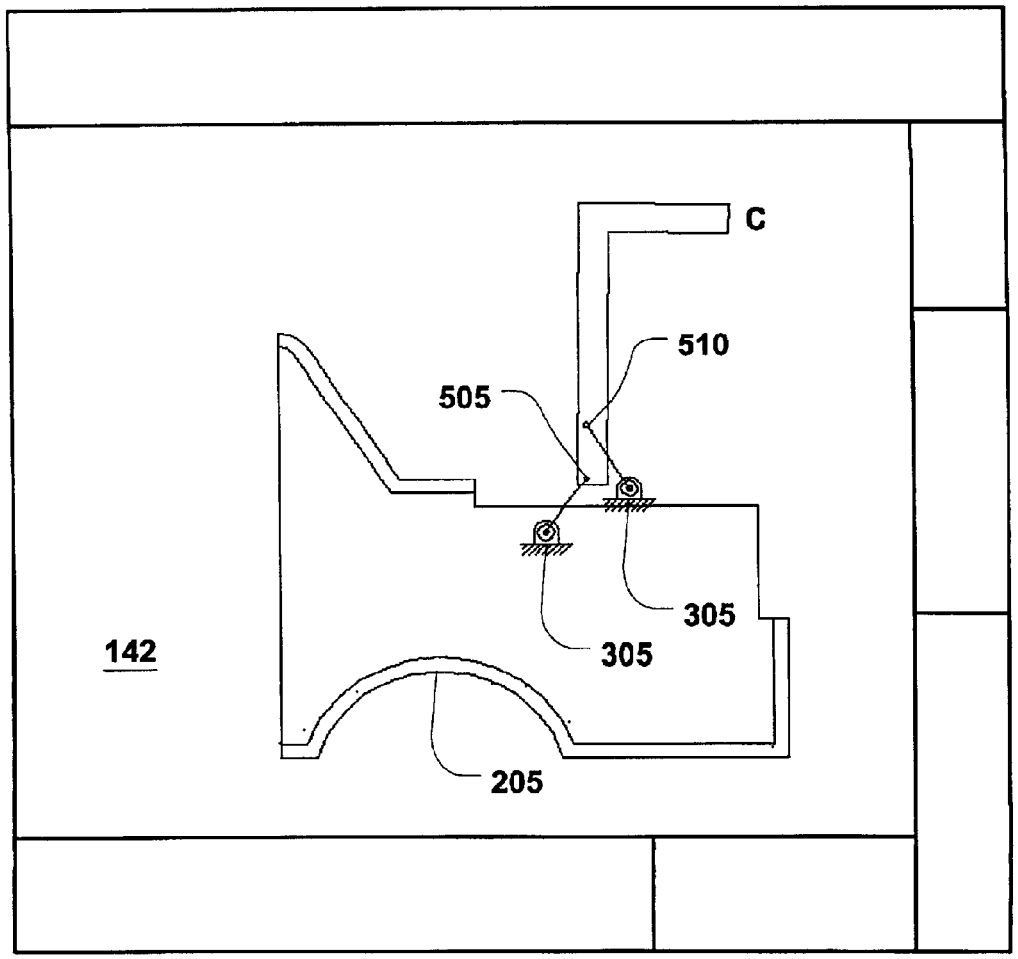

FIGS. 5–5B show another feature of the present invention allowing the synthesized mechanism to be incorporated and integrated into the inputted construct. Specifically, as shown, mechanism solution 300 of FIGS. 3–3C may be incorporated with trunk hood 200 to create a real-world workable solution to the initial construct problem described above. As shown in FIGS. 5–5B, ground linkage points 505 and 510 are coupled to trunk hood 200 such that trunk hood 200 can move through positions A, B, and C respectively. As compared with FIGS. 3–3C, FIGS. 5–5C show mechanism solution 300 integrated into trunk hood 200 as opposed to being superimposed onto trunk hood providing a more real-world application for the mechanism solution.

Figure 6:
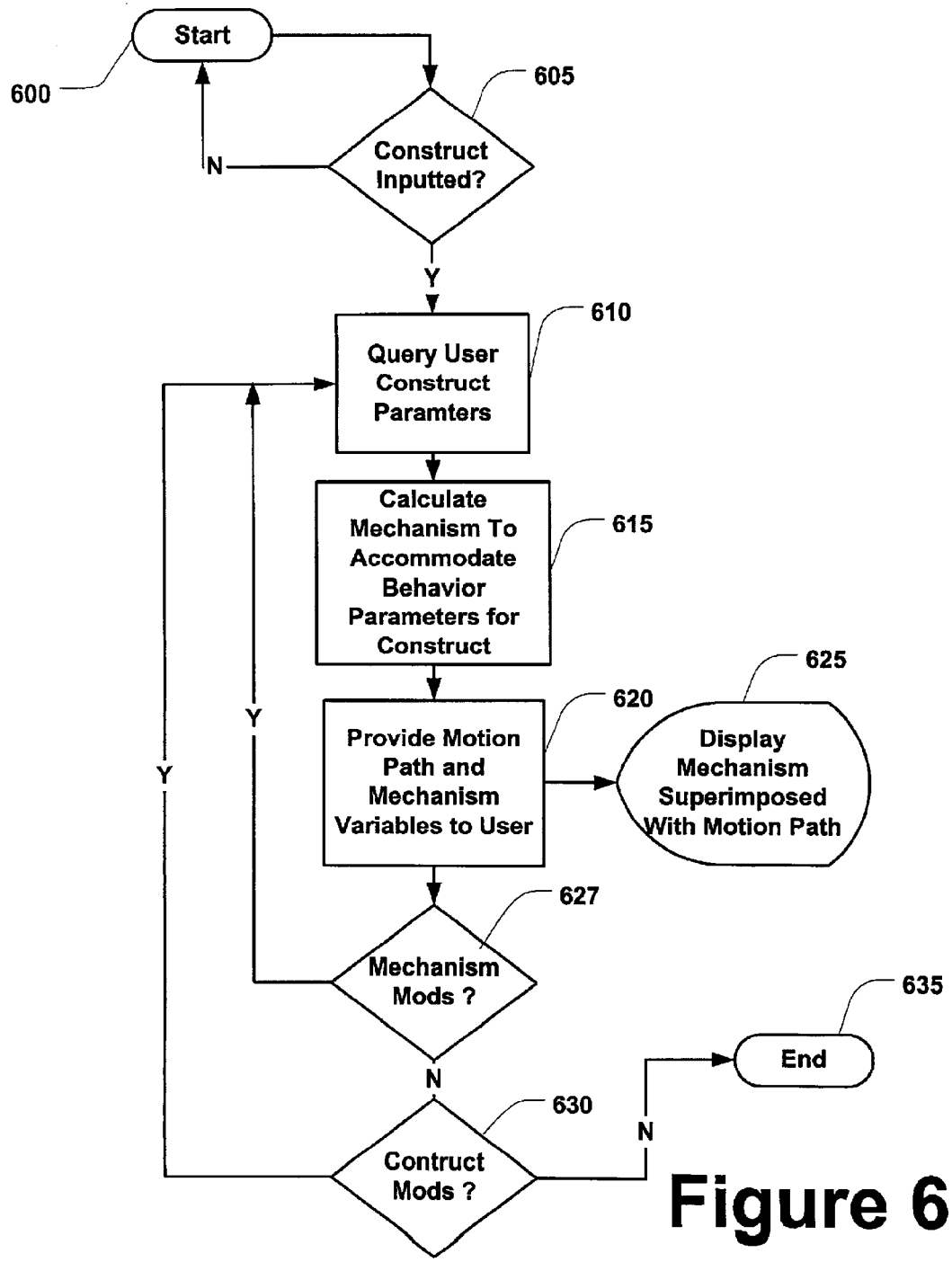
FIG. 6 is a flowchart of the general processing performed by the present invention.

FIG. 6 shows the processing performed by the system of the present invention to provide desired mechanisms. Processing starts at block 600 and proceeds to block 605 where a check is performed to determine if a construct has been inputted. To model the construct's desired function, the construct may be required to be inputted having a first and second position. If there is no inputted construct, processing reverts to block 600. However, if the contrary is true, processing proceeds to block 610 where the user is queried to enter variables for the inputted construct. From there processing proceeds to block 615 where relevant position data is extracted from the inputted data to calculate and synthesize appropriate mechanisms that accommodate desired behavior parameters (e.g. a particular motion path) for the inputted construct. The user is then provided with the various variables for the mechanism at block 620. The mechanism, mechanism parameters, and construct are then ready for display at block 625. This may include mechanism part(s) as they would move through the desired positions. A check is then performed at block 627 to see if any modifications have been made to the presented mechanism. If modifications are made by a participating user to the displayed mechanism, processing reverts to block 610. However, if the contrary is true, processing proceeds to block 630 where a check is performed to determine if there are any modifications required for the inputted construct. If modifications are required, processing reverts back to block 610 and proceeds therefrom. However, if the contrary proves to be true, processing ends at block 435.

It is understood that the two-dimensional examples provided (e.g. exemplary construct, and exemplary mechanism solution) to describe the present invention are merely illustrative of the inventive concepts described herein, and that the present invention should not be limited to these examples. Rather, the present invention extends to the design, synthesis, and analysis of mechanisms in three-dimensions as well.

In sum, the present invention provides a system and methods for the generating of mechanism solutions based on inputted desired functions such as part positions by extracting functional requirements data from such inputted data so that the designer or engineer can view the mechanism solutions in space and thereby design the desired mechanism or mechanisms, preferably using a computer aided design (CAD) computing application. It is understood, however, that the invention is susceptible to various modifications and alternative constructions. There is no intention to limit the invention to the specific constructions described herein. On the contrary, the invention is intended to cover all modifications, alternative constructions, and equivalents falling within the scope and spirit of the invention.

It should also be noted that the present invention may be implemented in a variety of computer graphics applications. The various techniques described herein may be implemented in hardware or software, or a combination of both. Preferably, the techniques are implemented in computer programs executing on programmable computers that each include a processor, a storage medium readable by the processor (including volatile and non-volatile memory and/or storage elements), at least one input device, and at least one output device. Program code is applied to data entered using the input device to perform the functions described above and to generate output information. The output information is applied to one or more output devices. Each program is preferably implemented in a high level procedural or object oriented programming language to communicate with a computer system. However, the programs can be implemented in assembly or machine language, if desired. In any case, the language may be a compiled or interpreted language. Each such computer program is preferably stored on a storage medium or device (e.g., ROM or magnetic disk) that is readable by a general or special purpose programmable computer for configuring and operating the computer when the storage medium or device is read by the computer to perform the procedures described above. The system may also be considered to be implemented as a computer-readable storage medium, configured with a computer program, where the storage medium so configured causes a computer to operate in a specific and predefined manner.

Although an exemplary embodiment of the invention has been described in detail above, those skilled in the art will readily appreciate that many additional modifications are possible in the exemplary embodiment without materially departing from the novel teachings and advantages of the invention. Accordingly, these and all such modifications are intended to be included within the scope of this invention as defined in the following claims.

What is claimed is:

1. A system for the graphical synthesis of mechanisms comprising:

a computer processor capable of processing graphical information and data;

computer memory, electronically coupled to said computer processor, capable of storing said graphical information and data;

a display device electronically coupled to said computer processor, displaying graphical information to an operator;

an operator input interface electronically coupled to said computer processor allowing an operator to manipulate said graphical information on said display device; and a computing application residing in said computer memory and running on said computer processor, wherein said computing application receives operator input representative of constructs, said input indicative of desired functional requirements, from said operator input interface, and processes said operator input to extract position and angle data for use to calculate mechanism solutions having the particular desired functional requirements said mechanism capable of behaving in accordance with said inputted functional requirements, said computing application further calculating parameters associated with said calculated mechanism for display as graphical information on said display device for said operator to view.

2. The system as recited in claim 1, wherein said computing application comprises a computer aided design (CAD) computing application.

3. The system as recited in claim 2, wherein said operator input is represented as positions of the mechanism's part(s) by said computing application.

4. The system as recited in claim 3, wherein said positions comprise beginning, ending and/or other positions of the mechanisms' part(s).

5. The system as recited in claim 4, wherein one position is representative of a beginning point along a desired motion path for said inputted construct.

6. The system as recited in claim 4, wherein one position is representative of a final point along a desired motion path for said inputted construct.

7. The system as recited in claim 4, wherein said mechanism solutions are generated based on functional requirements by extracting functional requirements data from said input representative of constructs.

8. The system as recited in claim 1, wherein said mechanism solutions include any of: a coupler curve, angle positions, points in space, and/or a mechanisms' motion path.

9. The system as recited in claim 1, further comprising a data store.

10. The system as recited in claim 9, wherein said data store comprises a list of pre-defined constructs, said pre-defined constructs being offered to participating users through said operator interface to facilitate construct design.

11. The system as recited in claim 10, wherein sad data store further comprises mechanism components, said mechanism components utilized when synthesizing mechanisms for inputted constructs.

12. The system as recited in claim 11, wherein said mechanism components comprise any of linkage points, links, link assemblies, mechanism bars, and mechanisms.

13. The system recited in claim 1, wherein said computing application operates in a computer network environment, said computer network environment comprising any of: a fixed-wire LAN, a wireless LAN, a fixed-wire WAN, a wireless WAN, a fixed-wire intranet, a wireless intranet, a fixed-wire extranet, a wireless extranet, the Internet, and the wireless Internet.

14. A method for calculating and generating computerized graphical representations of mechanism solutions on a computing system having, memory, an input interface, and a display device, comprising the acts of:
    receiving information indicative of a construct's desired function and intended positions for said construct by said computing system;
    processing said inputted information on said computing system to produce a mechanism viewable to the operator; and
    displaying said mechanism solutions based on the inputted desired function operating on said inputted construct on said display device.

15. The method as recited in claim 14, wherein said inputting step comprises the step of receiving data points from said input interface, said data points representative of said desired construct and desired construct positions.

16. The method as recited in claim 14, wherein said processing step comprises the steps of:
    extracting position data from said received intended positions, said position data being represented by vectors comprising any of position and angle information; and
    calculating an appropriate mechanism using said position data.

17. The method as recited in claim 16, wherein said calculating step comprises the step of providing mechanisms having behavior parameters that accommodate said construct having said construct positions, said mechanism behavior parameters comprising at least one of a group comprising: mechanism's motion path, mechanism's coupler curve, and associated mechanism elements.

18. The method as recited in claim 14 further comprising the step of storing said synthesized mechanism and said inputted function in said memory.

19. A computer readable storage medium comprising computer-executable instructions for instructing a computer to perform the acts recited in claim 14.

20. A method to synthesize mechanisms having desired behavior comprising the acts of:
    providing construct dimensional information and construct positional parameter information, said positional parameters indicative of said constructs' desired positions along a desired motion path; and
    processing said positional parameters to suggest mechanisms that are operable on said constructs.

21. The method as recited in claim 20, wherein said providing act comprises the act of receiving positional data from participating users through a graphics computing application, said positional data representative of desired positions for said constructs.

22. The method as recited in claim 20, wherein said processing act comprises the acts of extracting and calculating the vector values from said positional parameters and from said construct dimensional information, said vector values used to calculate mechanisms operable on said constructs.

23. The method as recited in claim 22, wherein said vector values comprise a position value and an angle value.

24. A system to synthesize mechanisms for constructs to move along desired motion paths comprising:
    an input means, said input means comprising an interface to receive data;
    a processing means, said processing means cooperating with said input means to extract relevant position data from said received data for use when synthesizing mechanisms; and
    a display means, said display cooperating with said processing means display output representative of said synthesized mechanisms.

25. A system for designing, synthesizing, and analyzing mechanisms comprising:
    an interface system, said interface system capable of receiving data representative of two and three dimensional constructs for modeling in a computing modeling environment;
    an data extractor system, said data extractor system capable of extracting relevant data from said received data representative of said constructs; and
    a solver system, said solver system cooperating with said data extractor system to provide mechanism solutions; and
    a display system, said display system capable of displaying said mechanism solutions in conjunction with said inputted constructs, wherein said mechanisms and said constructs are amenable to animation in a modeling space of a computing modeling environment.

26. A method for designing, synthesizing, and analyzing mechanisms comprising the steps of:
    receiving data representative of constructs by a computing modeling environment, said construct data indicative of desired functional requirements;
    extracting relevant data from said received construct data;
    providing mechanism solutions to satisfy said functional requirements, said solutions calculated using said extracted data; and
    displaying said mechanism solutions and said constructs such that said mechanisms solutions are operable on said constructs.

* * * * *